(12) United States Patent
Kuhn

(10) Patent No.: US 7,233,274 B1
(45) Date of Patent: Jun. 19, 2007

(54) CAPACITIVE LEVEL SHIFTING FOR ANALOG SIGNAL PROCESSING

(75) Inventor: Jay A. Kuhn, Seattle, WA (US)

(73) Assignee: Impinj, Inc., Seattle, WA (US)

( * ) Notice: Subject to any disclaimer, the term of this patent is extended or adjusted under 35 U.S.C. 154(b) by 0 days.

(21) Appl. No.: 11/313,549

(22) Filed: Dec. 20, 2005

(51) Int. Cl.
H03M 1/38 (2006.01)

(52) U.S. Cl. ............... 341/161; 341/118; 341/120; 341/154; 341/155; 341/159

(58) Field of Classification Search ........... 341/118, 341/120, 155, 161
See application file for complete search history.

(56) References Cited

U.S. PATENT DOCUMENTS

| | | | |
|---|---|---|---|
| 3,958,236 A | 5/1976 | Kelly | |
| 4,163,947 A | 8/1979 | Weedon | |
| 4,240,068 A | 12/1980 | Handy | |
| 4,251,803 A * | 2/1981 | Debord et al. | 341/118 |
| 4,259,582 A | 3/1981 | Alert | |
| 4,272,759 A | 6/1981 | Handy | |
| 4,380,005 A * | 4/1983 | Debord et al. | 341/118 |
| 4,471,341 A | 9/1984 | Sauer | |
| 4,472,648 A | 9/1984 | Prentice | |
| 4,763,105 A | 8/1988 | Jenq | |
| 4,783,783 A | 11/1988 | Nagai et al. | |
| 4,833,695 A | 5/1989 | Greub | |
| 4,851,792 A | 7/1989 | Ochiai et al. | |
| 4,914,440 A | 4/1990 | Ramet | |
| 4,935,702 A | 6/1990 | Mead et al. | |
| 4,958,123 A | 9/1990 | Hughes | |
| 4,962,380 A | 10/1990 | Meadows | |
| 4,968,988 A | 11/1990 | Miki et al. | |
| 4,998,262 A | 3/1991 | Wiggers | |
| 5,029,063 A | 7/1991 | Lingstaedt et al. | |
| 5,099,156 A | 3/1992 | Delbruck | |
| 5,159,337 A | 10/1992 | Lankreijer | |
| 5,166,562 A | 11/1992 | Allen et al. | |
| 5,177,697 A | 1/1993 | Schanen et al. | |
| 5,243,347 A | 9/1993 | Jackson et al. | |
| 5,258,660 A | 11/1993 | Nelson et al. | |
| 5,270,963 A | 12/1993 | Allen et al. | |
| 5,296,752 A | 3/1994 | Groeneveld et al. | |
| 5,298,866 A | 3/1994 | Kaplinsky | |
| 5,329,240 A | 7/1994 | Kubota et al. | |
| 5,361,277 A | 11/1994 | Grover | |
| 5,376,935 A | 12/1994 | Seligson | |
| 5,398,262 A | 3/1995 | Ahuja | |

(Continued)

Primary Examiner—Khai M. Nguyen
(74) Attorney, Agent, or Firm—Merchant & Gould PC

(57) ABSTRACT

An analog processing block is arranged to receive an input signal through an AC coupling circuit. A digitally programmable voltage reference (DPVR) circuit is arranged to provide selection of a voltage reference that is DC coupled through a high impedance circuit to the AC coupling circuit. The input to the analog processing block includes the AC coupled input signal and the DC level from the selected voltage reference such that the DC level is effectively shifted for the analog processing block. The analog processing block may include any number of analog functions including: buffering, level shifting, scaling, integrating, and analog-to-digital conversion for digital signal processing, to name a few. A digital control logic circuit and a trim map can be arranged to control adjustments to the DPVR such that the effects of any non-ideal conditions on the analog processing block are minimized. The trim map may include non-volatile memory devices.

27 Claims, 11 Drawing Sheets

U.S. PATENT DOCUMENTS

| | | |
|---|---|---|
| 5,422,915 A | 6/1995 | Byers |
| 5,491,442 A | 2/1996 | Mirov et al. |
| 5,543,791 A | 8/1996 | Riggio, Jr. |
| 5,557,272 A | 9/1996 | Riggio, Jr. |
| 5,627,392 A | 5/1997 | Diorio et al. |
| 5,666,118 A | 9/1997 | Gersbach |
| 5,684,738 A | 11/1997 | Au et al. |
| 5,689,205 A | 11/1997 | Hughes et al. |
| 5,710,563 A | 1/1998 | Vu et al. |
| 5,760,616 A | 6/1998 | Vallancourt |
| 5,763,912 A | 6/1998 | Parat et al. |
| 5,852,640 A | 12/1998 | Kliza et al. |
| 5,952,946 A | 9/1999 | Kramer et al. |
| 5,990,512 A | 11/1999 | Diorio et al. |
| 5,990,814 A * | 11/1999 | Croman et al. .............. 341/118 |
| 5,990,816 A | 11/1999 | Kramer et al. |
| 6,014,044 A | 1/2000 | Kramer et al. |
| 6,125,053 A | 9/2000 | Diorio et al. |
| 6,342,848 B1 * | 1/2002 | Johnson et al. .............. 341/118 |
| 6,603,416 B2 * | 8/2003 | Masenas et al. ............. 341/120 |
| 6,624,773 B2 | 9/2003 | Wong |
| 6,664,909 B1 | 12/2003 | Hyde et al. |
| 6,891,488 B1 | 5/2005 | McDaniel et al. |
| 7,038,544 B2 | 5/2006 | Diorio et al. |
| 7,038,603 B2 | 5/2006 | Diorio et al. |
| 7,079,872 B2 | 5/2006 | Diorio et al. |
| 7,084,795 B2 * | 8/2006 | Smith et al. ................. 341/120 |
| 7,106,238 B2 * | 9/2006 | Chiang ....................... 341/155 |

* cited by examiner

CAPACITIVE LEVEL SHIFTING FOR ANALOG SIGNAL PROCESSING

FIELD OF THE INVENTION

The present invention generally relates to signal processing. More particularly, the present invention is related to a method and apparatus for adjusting a DC level associated with an AC coupled input signal for signal processing.

BACKGROUND

Analog signal processing circuits are often desired in electronic systems where transmission and reception of signals can have very specific system requirements. Often times, signals are encoded, encrypted, modulated, phase-shaped, or otherwise manipulated for transmission in the system. The various signal manipulations can be performed to improve signal reception as well as to prevent unauthorized reception. The resulting signal may be transmitted to a receiving circuit, where the receiving circuit must understand how to extract the signal from the transmission.

The various described signal manipulations in the electronic system can be performed by analog function blocks or digital function blocks. Example analog function blocks include buffers, amplifiers, filters, level shifters, demodulators and integrators, to name a few. Example digital signal processing blocks include such functions as: decrypting, decoding, demodulating, filtering, scaling, to name a few. Depending on the desired signal processing functions, the selected analog function blocks can vary significantly such that custom-built circuits are necessary. In contrast, digital signal processing functions can be provided by a general-purpose processor, such as a CPU or a DSP core, where the processor is arranged to provide the various signal processing functions using algorithmic processing that can be changed with software. It is often preferable to translate the analog signals into the digital domain such that digital signal processing can be utilized.

An analog-to-digital converter (ADC) is a circuit that performs the translation between analog and digital signals. An example of a conventional ADC circuit (900) is illustrated in FIG. 9. ADC circuit 900 includes a resistor reference ladder and a comparator array. The resistor reference ladder is arranged to divide an analog reference voltage ($V_{REF}$) into a number of different reference voltages ($V_{REF1}$–$V_{REFN}$). Each of the comparators ($CP_1$–$CP_N$) in the comparator array is arranged to compare the analog input signal ($V_{IN}$) to a respective one of the reference voltages ($V_{REF1}$–$V_{REFN}$). Each of the comparators ($CP_1$–$CP_N$) has a respective output ($OUT_1$–$OUT_N$) which indicates whether or not the analog input signal ($V_{IN}$) is greater than its respective reference voltage. The various comparator outputs ($OUT_1$–$OUT_N$) provide a thermometer decode that indicates a value associated with the magnitude of the analog input signal ($V_{IN}$).

Another example of a conventional ADC circuit (1000) is illustrated in FIG. 10. ADC circuit 1000 includes a level shifting resistor ladder, a comparator array, a buffer, and a current source. The buffer is arranged to provide a buffered version of the analog input signal ($V_{IN}$) as signal $V_{IN1}$. The current source is arranged to provide a current ($I_{LS}$) coupled to the output of the buffer through the level shifting resistor ladder such that tap points in the level shifting resistor ladder each correspond to a DC level shifted version of the buffered input signal ($V_{IN1}$). In other words, $V_{IN2}=V_{IN1}+LS_1$, $V_{IN3}=V_{IN2}+LS_2$, and $V_{INN}=V_{IN(N-1)}+LS_{N-1}$. Each of the comparators ($CP_1$–$CP_N$) is arranged to compare a respective one of the analog input signals ($V_{IN1}$–$V_{INN}$) to the reference voltage ($V_{REF}$) to provide a respective one of the outputs ($OUT_1$–$OUT_N$). The various comparator outputs ($OUT_1$–$OUT_N$) again provide a thermometer decode that indicates a value associated with the magnitude of the analog input signal ($V_{IN}$).

Yet another example of a conventional ADC circuit (1100) is illustrated in FIG. 11. ADC circuit 1100 includes a resistor reference ladder, an array of sampling capacitors ($CS_1$–$CS_N$), a first array of switches ($S_{11}$–$S_{N1}$), a second array of switches ($S_{12}$–$S_{N2}$), an array of a comparator array ($CP_1$–$CP_N$), and an array of inverting amplifiers ($I_1$–$I_N$). The resistor reference ladder is substantially identical to that described previously with respect to FIG. 9. The switches and capacitors are arranged to sample the difference between a respective one of the reference voltages ($V_{REF1}$ through $V_{REFN}$) and the analog input signal ($V_{IN}$), while the inverting amplifier circuit is arranged to amplify the difference for input to a respective one of the comparators ($CP_1$–$CP_N$). For example, capacitor $CS_1$ is arranged to sample the difference between $V_{IN}$ and $V_{REF1}$, while capacitor $CS_2$ is arranged to sample the difference between $V_{IN}$ and $V_{REF2}$, etc. Each of the comparators is arranged to compare the sampled difference voltage to a signal ground to provide a respective output ($OUT_1$–$OUT_N$). The various comparator outputs ($OUT_1$–$OUT_N$) again provide a thermometer decode that indicates a value associated with the magnitude of the analog input signal ($V_{IN}$).

BRIEF DESCRIPTION OF THE DRAWINGS

Non-limiting and non-exhaustive embodiments are described with reference to the following drawings.

DETAILED DESCRIPTION OF THE PREFERRED EMBODIMENT

Figure 1:
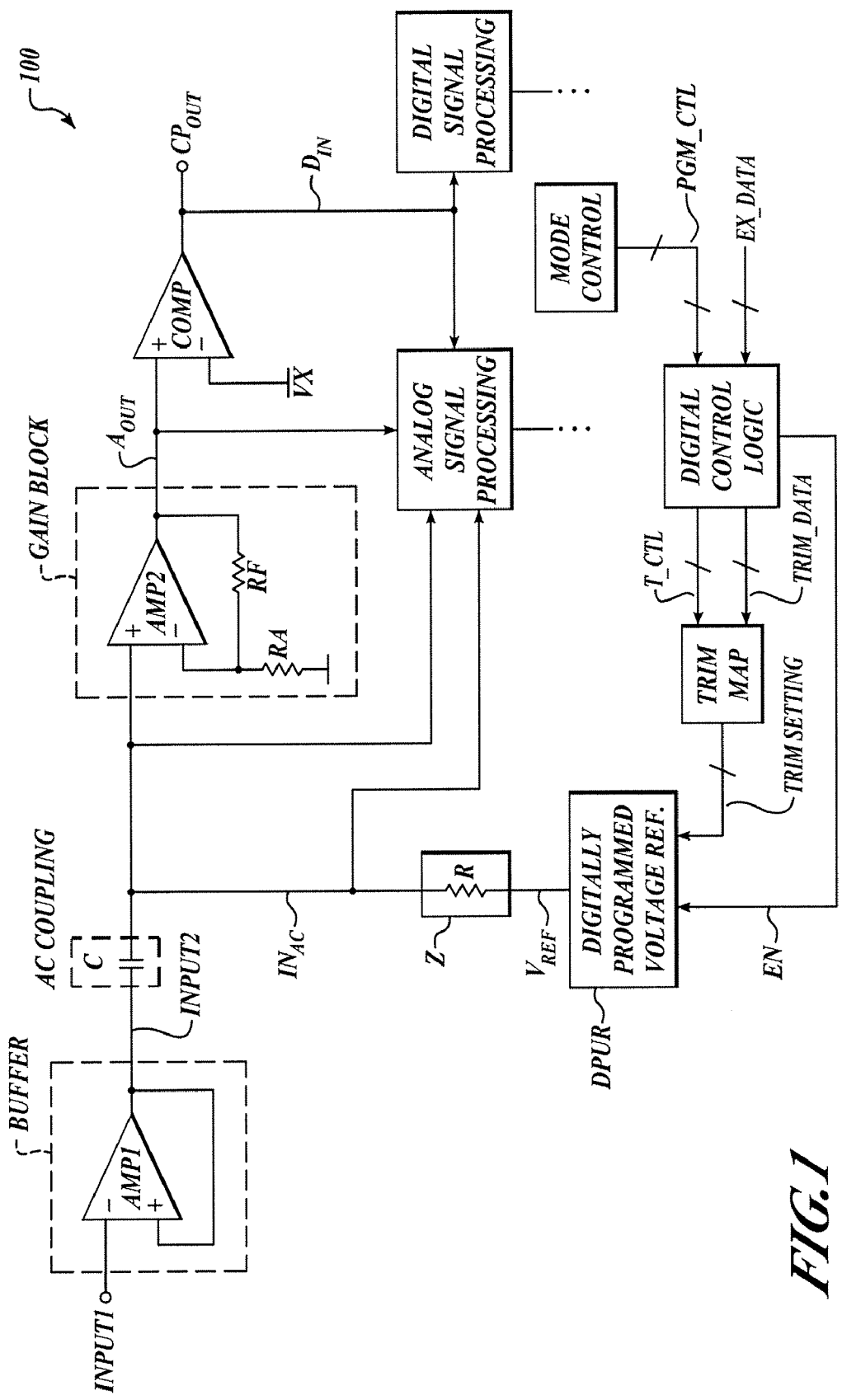
FIG. 1 is a schematic diagram of an analog processing circuit that employs capacitive level shifting in accordance with the present disclosure.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for the terms. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected or an indirect connection through one or more passive or active intermediary devices. The term "circuit" means either a single component or a multiplicity of components, either active and/or passive, that are coupled together to provide a desired function. The term "signal" means at least one current, voltage, charge, temperature, data, or other signal.

Briefly stated, an analog processing block is arranged to receive an input signal through an AC coupling circuit. A digitally programmable voltage reference (DPVR) circuit is arranged to provide selection of a voltage reference that is DC coupled through a high impedance circuit to the AC coupling circuit. The input to the analog processing block includes the AC coupled input signal and the DC level from the selected voltage reference such that the DC level is effectively shifted for the analog processing block. The analog processing block may include any number of analog functions including: buffering, level shifting, scaling, integrating, and analog-to-digital conversion for digital signal processing, to name a few. A digital control logic circuit and a trim map can be arranged to control adjustments to the DPVR such that the effects of any non-ideal conditions on the analog processing block are minimized. The trim map may include non-volatile memory devices.

The present disclosure applies generally to analog processing circuits, and has particular application in systems that have non-ideal effects from a variety of sources such as semiconductor processing based variations. Such processing variations may be manifested in voltage and/or current based offsets in circuits such as amplifier blocks and comparator blocks to name a few. It is understood and appreciated that offsets are merely one example of a non-ideal effect and others are also contemplated. The present disclosure contemplates all varieties of non-ideal effects by evaluating their net result at the output of the various signal-processing circuits.

After production of the circuits for the present disclosure, a test signal can be applied to the circuit such that the output of the signal processing circuits can be evaluated for each of the available DC level adjustments from the DPVR. By adjusting the DC level at the input side of such signal processing circuits and evaluating the effects on the outputs of those circuits, a preferred DC level can be identified. The various settings for the DPVR circuit can be stored in a trim map for later retrieval during operation in the field. The trim map can be implemented on-chip or off-chip, and may include non-volatile memory (NVM) structures, fusing circuits, anti-fusing circuits, read-only memory (ROM) circuits, programmable read-only memory (PROM) circuits, erasable programmable read-only memory (EPROM) circuits, electrically erasable programmable read-only memory (EEPROM) circuits, or any other appropriate means as will be understood by the present disclosure.

The present disclosure has evaluated many conventional analog-to-digital converter (ADC) circuits, and other signal processing circuits, to identify problems that have resulted in the present disclosure. A limited number of such examples are illustrated by the ADC circuits of FIGS. 9–11.

Figure 9:
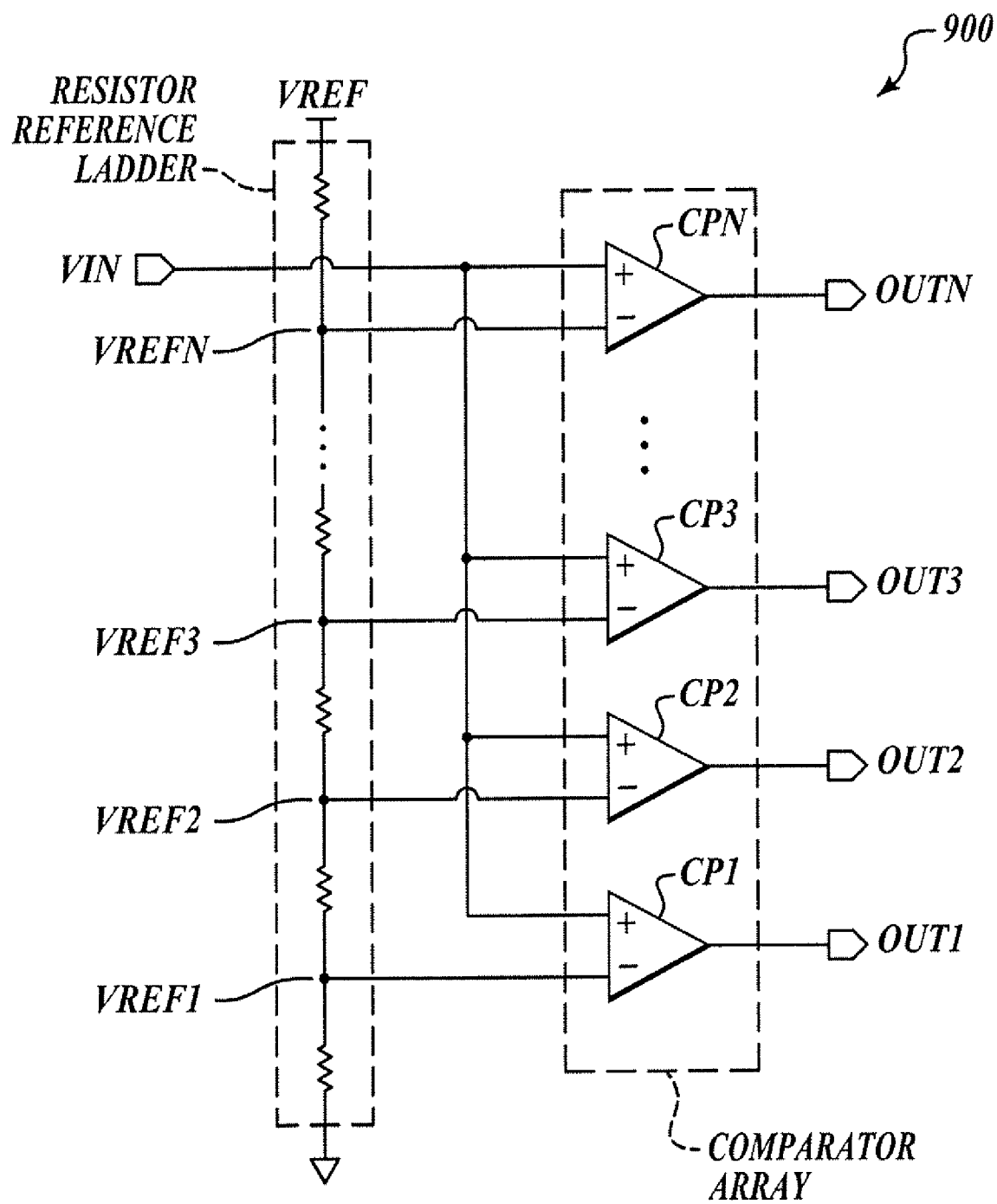
FIG. 9 is a schematic diagram of a conventional analog-to-digital converter circuit.

FIG. 9 illustrates a flash-type converter as previously described. The input signal ($V_{IN}$) is compared against a number (N) of reference voltage ($V_{REF1}$–$V_{REFN}$) that is generated using the resistor reference ladder. The comparators ($CP_1$–$CP_N$) convert the input signal ($V_{IN}$) to a digital quantity that results from the collection of outputs ($OUT_1$–$OUT_N$) from the comparators ($CP_1$–$CP_N$). Ideally, the reference voltages are exact at the input of the comparators, the comparators are very fast, and there is no input referred offset on the comparator inputs.

A practical implementation of circuit 900 will always have some finite error in each reference voltages due to mismatches in various devices (e.g., mismatches between resistors in the resistor reference ladder). Also, each comparator will have an input referred offset voltage that may vary from comparator to comparator, and also may vary based on the common-mode voltage for each comparator. Conventional efforts to reduce the input referred offset often use large area transistors on the input differential pair, which requires larger chip areas and results in increased parasitic capacitance on the inputs to the comparator. Negative effects of the increased parasitic capacitance include: slower performance due to input slewing, and noise from the comparators (e.g., the high gain of the comparator results in significant voltage swings that look like switching noise that can "kickback") that can couple back to the resistor reference ladder. The values of the resistors in the resistor reference ladder can be reduced to minimize the effect of noise from the comparators at the cost of increased minimum operating current in the resistors. The comparators of circuit 900 must be able to accommodate a variety of common-mode voltages to work over the full range of $VREF_1$ through $VREF_N$. Thus the comparators must either be matched to one another using a robust design that can accommodate the full common-mode range, or different comparator circuits must be used for each of the different DC operating voltage ranges.

Figure 10:
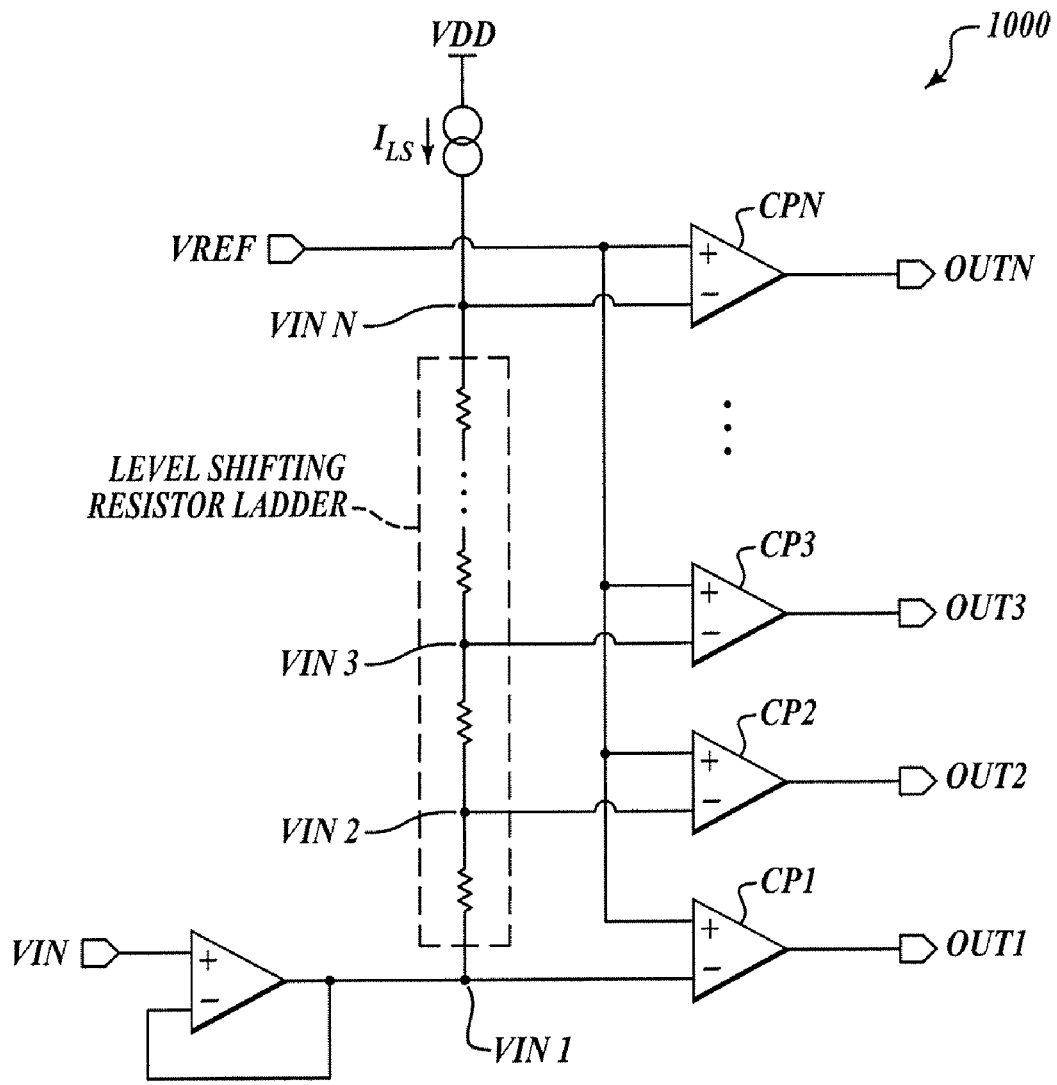
FIG. 10 is a schematic diagram of another conventional analog-to-digital converter circuit.

FIG. 10 illustrates another flash-type converter as previously described. The input signal ($V_{IN}$) is converted into a number (N) of input voltage ($V_{IN1}$–$V_{INN}$) that is generated using the level shifting resistor ladder. The comparators ($CP_1$–$CP_N$) compare the level shifted inputs to a reference voltage ($V_{REF}$) to convert the input signal ($V_{IN}$) to a digital quantity that results from the collection of outputs ($OUT_1$–$OUT_N$) from the comparators ($CP_1$–$CP_N$). Ideally, the level shifted input voltages (VIN1–VINN) are precisely level shifted at the input of the comparators, the comparators are very fast, and there is no input referred offset on the comparator inputs.

Similar to the discussion above for FIG. 9, a practical implementation of circuit 1000 will always have some finite error in the level shifting due to mismatches in various devices. For example, mismatches between resistors in the resistor ladder result in an error in the level shifting between each resistor. Any variations in the magnitude of the current from the current source will also result in an error in the level shifting. Any offset errors from the buffer will also result in an error in the level shifting. Similar to that described previously, the values of the resistors may need to be reduced to improve the speed or bandwidth of the circuit and minimize kickback. One disadvantage is the addition of the buffer that drives the bottom of the resistor ladder, where the buffer consumes additional power, and must be robustly designed to accommodate the input range for $V_{IN}$.

Figure 11:
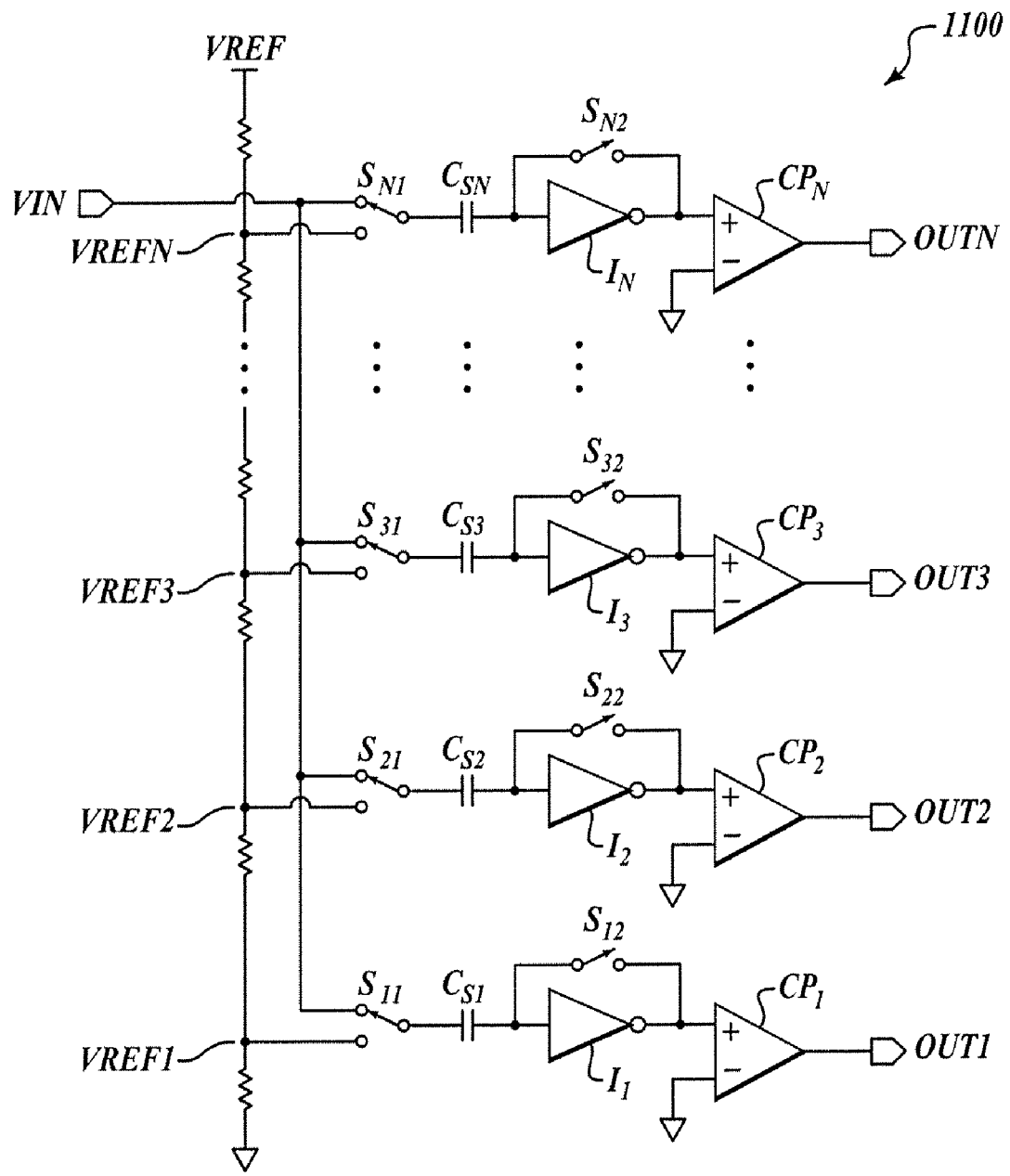
FIG. 11 is a schematic diagram of still another conventional analog-to-digital converter circuit.

FIG. 11 illustrates another flash-type converter as previously described. The reference voltages ($V_{REF1}$ through $V_{REFN}$) from the resistor ladder are sampled by the capacitors ($CS_{11}$ through $CS_{1N}$) during one time interval (e.g., switches $S_{11}$ through $S_{1N}$ in one position), while the input voltage ($V_{IN}$) is sampled at another time interval (e.g., switches $S_{11}$ through $S_{1N}$ in another position). Thus, the capacitors ($CS_{11}$ through $CS_{1N}$) effectively sample the difference between the input signal ($V_{IN}$) and the reference voltages ($V_{REF1}$ through $V_{REFN}$). Switches $S_{12}$–$S_{N2}$ are arranged to zero the inverting amplifiers ($I_1$ through $I_N$) when the reference voltages are sampled such that the circuit is auto-zeroing.

Similar to the discussion above for FIGS. 9 and 10, a practical implementation of circuit 1100 will always have some finite error due to mismatches in various devices. For example, mismatches between resistors in the resistor ladder result in an error in the reference voltages. Although offset errors from the inverting amplifiers are not an issue since this offset is effectively zeroed, mismatches in the gain of the various amplifiers may be an issue. The kickback issues previously described are a very big issue for circuit 1100, since switches are necessary to perform the sampling and auto-zeroing functions. Moreover, the switches add a further parasitic load on the resistor ladder circuit, requiring additional setting time for stable sampling operation. The overall effect is that the noise coupled back to the reference ladder is significant and lower valued resistors need to be used for high speed operation.

The above described limitations, problems, as well as others, have been evaluated and considered as part of the present disclosure. While the circuits that are described herein are shown as single-ended implementations, it is understood that fully-differential implementations are also considered within the scope of this disclosure. For fully-differential implementations, buffers, amplifiers, comparators and/or any other pertinent circuit blocks will include both differential inputs and differential (or complementary) outputs. Moreover, it is also understood that each signal node in a fully-differential circuit includes a complementary signal node that is 180 degrees out of phase with respect to the other signal node. The described figures illustrate single-ended circuits merely as a convenience, while expecting both single-ended and fully-differential circuit implementations to be within the scope of this disclosure.

FIG. 1 is a schematic diagram of an analog processing circuit (100) that employs capacitive level shifting in accordance with the present disclosure. The analog processing circuit (100) includes: an optional buffer circuit, an ac coupling circuit, an analog processing block, an analog signal processing circuit, a digital signal processing circuit, a digitally programmed voltage reference (DPVR), a trim map circuit, a mode control circuit, and a high impedance DC coupling circuit (Z).

There are a number of ways of implementing the analog processing circuit (100). In some embodiments of circuit 100, the analog processing block includes a gain block and a comparator.

The buffer circuit is arranged to receive an input signal (INPUT1) and provide a buffered input signal (INPUT2) to an input side of the AC coupling circuit. The AC coupling circuit provides an AC coupled input signal (INAC) in response to signal INPUT2. The gain block is arranged to receive the ac coupled input signal (INAC) and provide an amplified signal (AOUT) that is gain scaled relative to the ac coupled input signal (INAC). The comparator circuit is arranged to compare the amplified signal (AOUT) to a reference level (VX) and provide a comparator output signal to terminal (CPOUT) as signal DIN. The analog signal processing circuit is arranged to provide signal processing functions to any number of a variety of input signals, including but not limited to signals: INAC, AOUT, and DIN. The digital signal processing circuit is arranged to provide signal processing functions in response to any number of digital input signals, including but not limited to signal DIN.

The DPVR circuit is arranged to provide a DC voltage level (VREF) to the output side of the AC coupling circuit, where the DC voltage level (VREF) is adjusted in response to a programming signal (TRIM SETTING) when enabled by an enable signal (EN). The trim setting signal is provided by the trim map circuit in response to a control signal (T_CTL) and an indexing signal that corresponds to data associated with trimming (TRIM_DATA) for the system. The control signal (T_CTL), the indexing signal (TRIM_DATA), and the enable signal (EN) are provided by the digital control logic, which is response to a program control signal (PGM_CTL) and a data signal (ex_DATA). The program control signal (PGM_CTL) may be provided by a mode control circuit that only allows programming during a predetermined mode. Contemplated modes will be described later. The above described system is merely one example system that is contemplated, and many others are also considered within the scope of the present disclosure. The presently disclosed invention contemplates that the DC level associated with the output side of the AC coupling circuit is adjusted by the DPVR circuit through the high impedance DC coupling circuit such that the AC coupled signal can be further processed by some other analog processing mechanisms such as, but not limited to: the analog signal processing circuit, the comparator, the digital signal processor, an others. The DPVR circuit is arranged to adjust the DC level for the AC coupled signal such that the overall effect on the analog processing mechanisms are adjusted. For example, the gain amplifier and the comparator circuit may each have offset voltages that effect the processing of the analog input signal and can potentially yield an error in the decision of the comparator relative to signal VX. The DPVR is used to adjust the DC signal level such that these and other offsets, and/or other non-ideal effects, are compensated such that the comparator can make an appropriate decision. Other examples are also contemplated; where the offsets and other non-ideal errors are adjusted out of the system using the DC offset adjust from the DPVR through the high impedance DC coupling circuit.

The buffer circuit is illustrated as an operational amplifier circuit (AMP1) that is arranged in a unity gain configuration as an inverting amplifier. In another example, a non-inverting buffer can be used. In still another example, the buffer circuit is eliminated. Many other input signal conditioners are also contemplated, including but not limited to any combination of, buffer circuits, voltage dividers, gain scalers, and level shifters, to name a few.

The AC coupling circuit is illustrated as a capacitor circuit (C), that may be implemented as any reasonable means including but not limited to: a single capacitor, a plurality of capacitors, one or more transistors that are configured to operate as a capacitor circuit, poly-silicon based capacitors, metal plate based capacitors, and others.

In some embodiments, the high impedance DC coupling circuit (Z) and the capacitance of the AC coupling circuit form a high pass filter. It is advantageous to choose values for the impedance of the high impedance DC coupling circuit (Z) and the capacitance of the AC coupling circuit so that the high pass filter allows the lowest frequency of interest to pass through the capacitor. This lowest frequency typically has values between 1 kHZ and 1 MHz, depending on the application.

In some embodiments, the impedance of the high impedance DC coupling circuit (Z) can be chosen to be as high as possible such that the capacitance of the AC coupling circuit can be as low as possible, and area utilized by the capacitor in the AC coupling circuit can be conserved. Advantageously, it is possible if the high impedance DC coupling circuit (Z) is implemented from materials that result in high resistance, such as an undoped polysilicon resistor.

The gain amplifier circuit is illustrated as a non-inverting gain amplifier that includes an operational amplifier circuit (AMP2) and two resistor circuits (RF and RA). Resistor circuits RF and RA are series coupled between the output of AMP2 and a circuit ground (e.g., GND), with a common-node coupled to the inverting input terminal of AMP2. The non-inverting input terminal of AMP2 is arranged to receive an input signal (e.g., INAC). Although the example gain amplifier circuit is arranged as a non-inverting amplifier, inverting gain amplifiers are also contemplated. In some examples, the gain amplifier may be unnecessary and thus eliminated.

Figure 2:
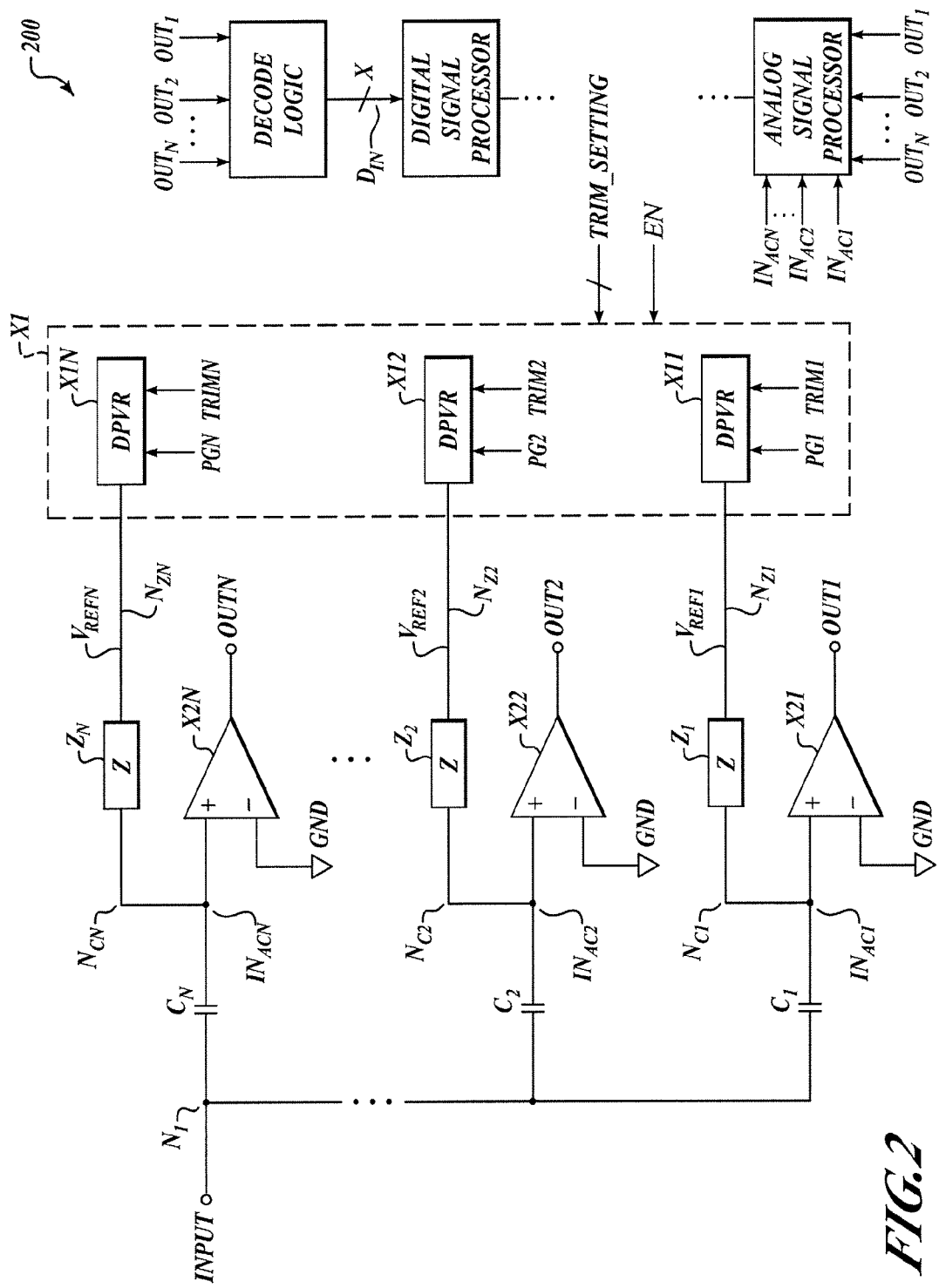
FIG. 2 is a schematic diagram of another analog processing circuit that employs capacitive level shifting in accordance with the present disclosure.

FIG. 2 is a schematic diagram of another analog processing circuit (200) that employs capacitive level shifting in accordance with the present disclosure. Analog processing circuit 200 includes capacitor circuits (C1–CN), differential circuits (X21–X2N), high impedance DC coupling circuits (Z1–ZN), a digitally programmed voltage reference circuit (X1), an optional analog signal processor, an optional decoder logic circuit, and an optional digital signal processor circuit.

Each of the capacitor circuits (C1–CN) is arranged to AC couple an input signal (INPUT) from node N1 to a respective internal node (NC1–NCN) as one of signals INAC1–INACN. The digitally programmed voltage reference circuit (X1) is arranged to provide a number (N) of reference voltage signals (VREF1–VREFN) at a corresponding one of nodes NZ1–NZN. Each of the high impedance DC coupling circuits (Z1–ZN) is arranged to DC couple a respective one of the reference voltage signals (VREF1–VREFN) from a respective one of nodes NZ1–NZN to a corresponding one of nodes NC1–NCN. Each of the differential circuits (X21–X2N) is arranged to compare a respective one of the input signals (INAC1–INACN) to a fixed reference potential (e.g., GND) to provide a corresponding one of the output signals (OUT1–OUTN). An analog signal processor can be arranged to evaluate a number of signals, including but not limited to INAC1–INACN and OUT1–OUTN. A decoder logic circuit can be arranged to evaluate the output signals (OUT1–OUTN) to provide a decoded logic signal (DIN) to the digital signal processor. The digital signal processor can be arranged to communicate with the analog signal processor as may be desired in an implementation.

In one example the differential circuits are comparators, while in another example the differential circuits are amplifiers. For example, circuit 200 can be arranged for use as a flash comparator circuit, where differential circuits X21–X2N are comparator circuits, the decoder logic is a thermometer decoder, and each of the comparator outputs (OUT1–OUTN) corresponds to the results of the comparison of the AC coupled input signals (INAC1–INACN) to the fixed reference potential (e.g., GND). For this example, the AC coupled input signals (INAC1–INACN) each have a DC level that corresponds to a respective one of the reference voltages (VREF1–VREFN). The DC levels are digitally adjusted (or digitally trimmed) so that the digital signal processor identifies the proper decode for a given input signal (INPUT). Similar arrangements can be made for analog signal processing for the case when differential circuits X21–X2N are amplifier circuits.

The digitally programmed voltage reference circuit is responsive to a programming signal (TRIM SETTING) when enabled by an enable signal (EN), similar to that previously described. In one example, an array of DPVR circuits (X11–X1N) are used to generate the reference voltages (VREF1–VREFN), where each of the DPVR circuits is responsive to a respective one of enable control signals (PG1–PGN) and a corresponding one of the program setting signals (TRIM1–TRIMN).

Figure 3:
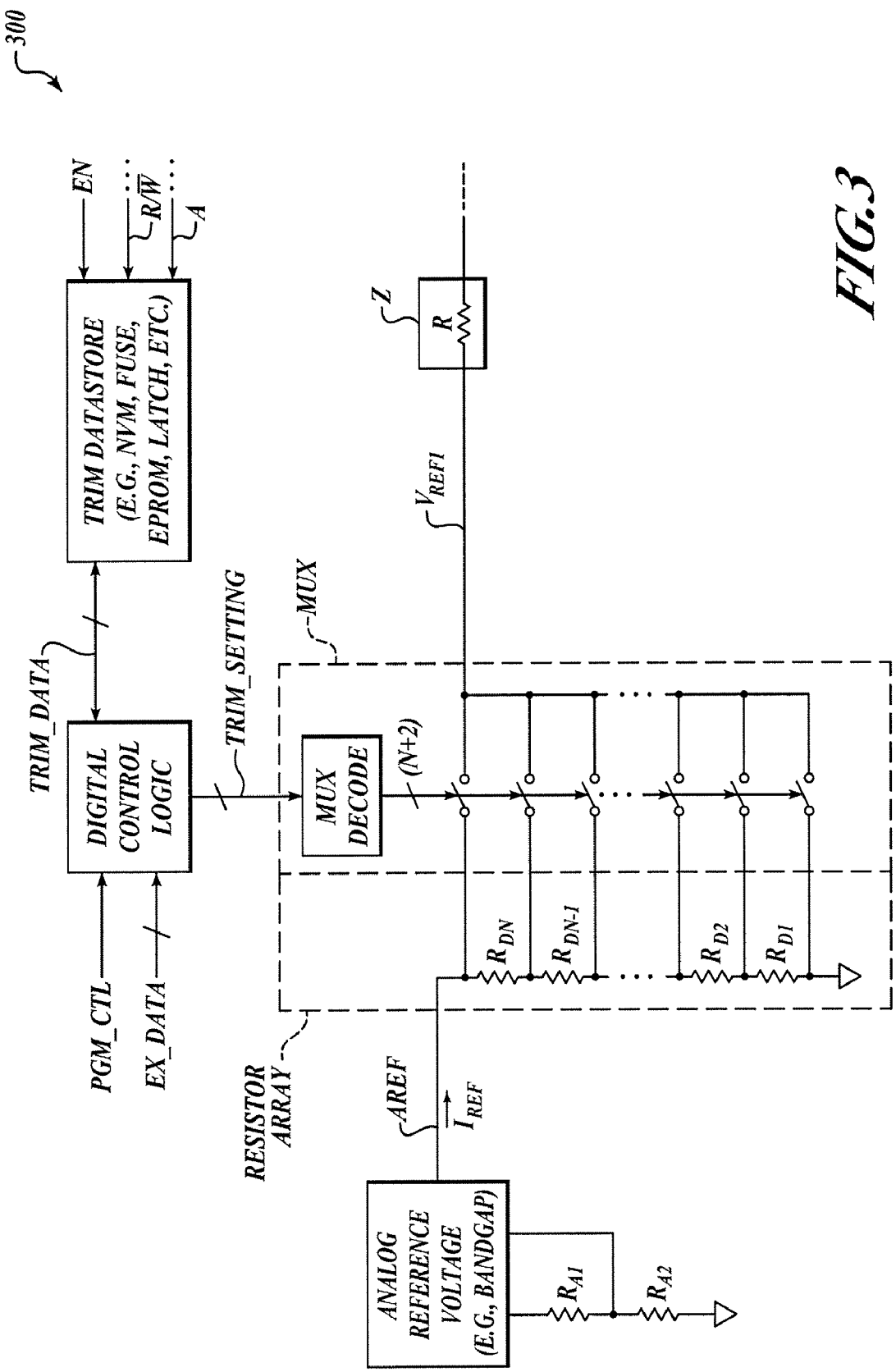
FIG. 3 is a schematic diagram of a digitally programmable voltage reference for an analog processing circuit that employs capacitive level shifting in accordance with the present disclosure.

FIG. 3 is a schematic diagram of a digitally programmable voltage reference (300) for an analog processing circuit that employs capacitive level shifting in accordance with the present disclosure. The digitally programmable voltage reference (DPVR) includes a resistor array, a multiplexer (MUX), and an analog reference circuit.

DPVR 300 is arranged to respond to a programming signal (TRIM_SETTING), from a digital control logic circuit. The digital control logic is arranged to provide the programming signal (TRIM_SETTING) in response to a programming control signal (PGM_CTL) and the evaluation of a data setting that can either be externally provided as ex_DATA, or previously stored as TRIM_DATA. In one example implementation, the digital control logic can store ex_DATA as TRIM_DATA in a TRIM DATASTORE circuit such as a non-volatile memory (NVM) circuit, a fuse circuit, an anti-fuse circuit, an EPROM circuit, an EEPROM circuit, a programmable logic device (PLD) circuit, a latch circuit, a register circuit, a random access memory (RAM) circuit, as well as others.

The analog reference circuit can be arranged to provide a reference voltage such as signal AREF or a reference current such as signal IREF. The resistor array includes a number of series coupled resistors (RD1–RDN), which are arranged in a voltage divider configuration to provide a plurality of reference voltages (e.g., VREF1–VREFN) at tap points in the voltage divider. The multiplexer (MUX) includes an array of switching circuits; where each switching circuit is arranged to selectively couple one of the reference voltages (VREF1–VREFN) to an output of the multiplexer as reference voltage VREF. Reference voltage VREF can then be coupled through a high-impedance DC coupling circuit (Z) as previously described. The multiplexer includes a decoder circuit (MUX DECODE) that is arranged to provide control signals to each of the switching circuits for selective activation in response to the programming signal (TRIM SETTING). The analog reference circuit can be a bandgap voltage reference, where the resistors in the bandgap circuit (e.g., RA1 and RA2) are manufactured from the same material as resistors RD1–RDN such that temperature related effects on the reference voltage (VREF) are minimized.

Figure 4:
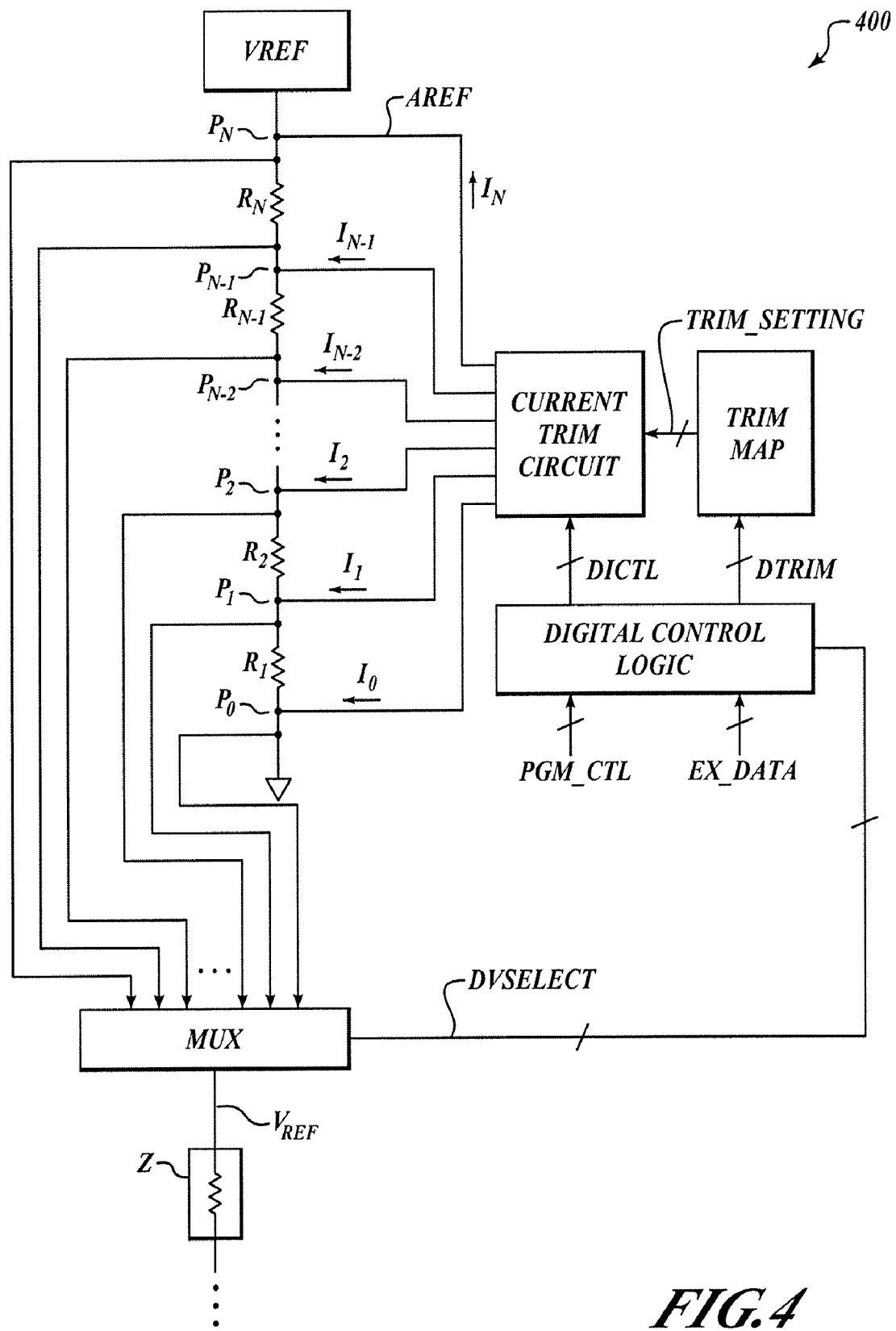
FIG. 4 is a schematic diagram of another digitally programmable voltage reference for an analog processing circuit that employs capacitive level shifting in accordance with the present disclosure.

FIG. 4 is a schematic diagram of another digitally programmable voltage reference (400) for an analog processing circuit that employs capacitive level shifting in accordance with the present disclosure. Digitally programmable voltage reference 400 includes a voltage reference circuit (VREF), an array of resistors (R1–RN), a multiplexer (MUX), and a current trim circuit.

Resistors R1–RN are arranged as a voltage divider circuit similar to that described previously. A voltage reference (AREF), or optionally a current reference (IREF), is coupled to the resistor array such that each tap point (P0–PN) of the resistor array (R1–RN) corresponds to a different voltage value that is coupled to an input of the multiplexer (MUX). The output of the multiplexer (MUX) corresponds to a selected reference voltage (VREF) that is coupled through a high impedance DC coupling circuit (Z) to another point such as the ac coupling circuit previously discussed. The multiplexer (MUX) is responsive to a selection control signal (DVSELECT) from the digital control logic.

The current trim circuit is arranged to provide one of current I0–IN to tap points P0–PN such that the voltage reference circuit can be digitally trimmed by the current trim circuit. The current trim circuit is responsive to the programming signals (TRIM_SETTING) from the trim map circuit. The digital control logic circuit is arranged to control the selection from the trim map circuit and the current trim circuit via signal DICTL and DTRIM, respectively. The digital control logic and the trim map circuit are operated in a similar fashion as that discussed previously.

Figure 5:
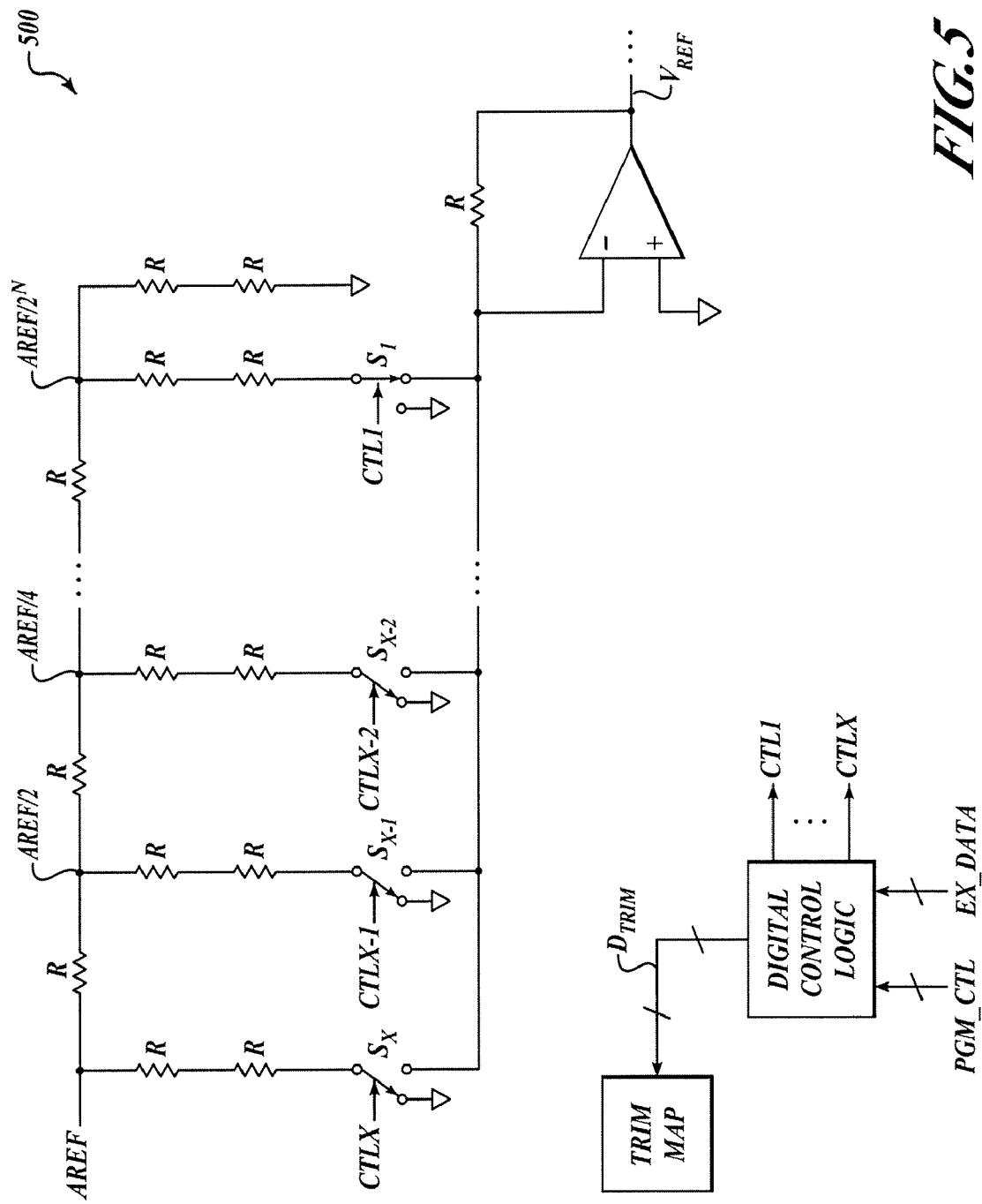
FIG. 5 is a schematic diagram of still another digitally programmable voltage reference for an analog processing circuit that employs capacitive level shifting in accordance with the present disclosure.

FIG. 5 is a schematic diagram of still another digitally programmable voltage reference (500) for an analog processing circuit that employs capacitive level shifting in accordance with the present disclosure. DPVR 500 includes an array of resistors, switches S1–SX, a digital control logic circuit, a trim map circuit, and a differential amplifier circuit.

The array of resistors are arranged as an R-2R resistor ladder that has an input voltage corresponding to AREF, yielding tap point voltages of AREF/2, AREF/4, . . . , $AREF/2^N$. Each of the switches (S1–SX) is arranged to selectively couple a respective leg of the R-2R ladder to either a circuit ground (e.g., GND) or to an inverting input of the differential amplifier circuit in response to a respective one of the control signals (CTL1–CTLX). A unit resistor (R) is coupled in the feedback path between the output of the differential amplifier and the inverting input of the differential amplifier circuit such the resulting reference voltage (VREF) is provided at the output of the amplifier as a binary programmed value such as: $VREF=AREF*(b_1/2^N+b_2/2^{(N-1)}+ \ldots b_{x-1}/2+b_x)$, where $b_1$–$b_x$ correspond to binary values associated with control signals CTL1–CTLX. The digital control logic is arranged to provide the control signals similar to that previously described, such that the DPVR provides a VREF that is determined by the trim map circuit's stored values.

Figure 6:
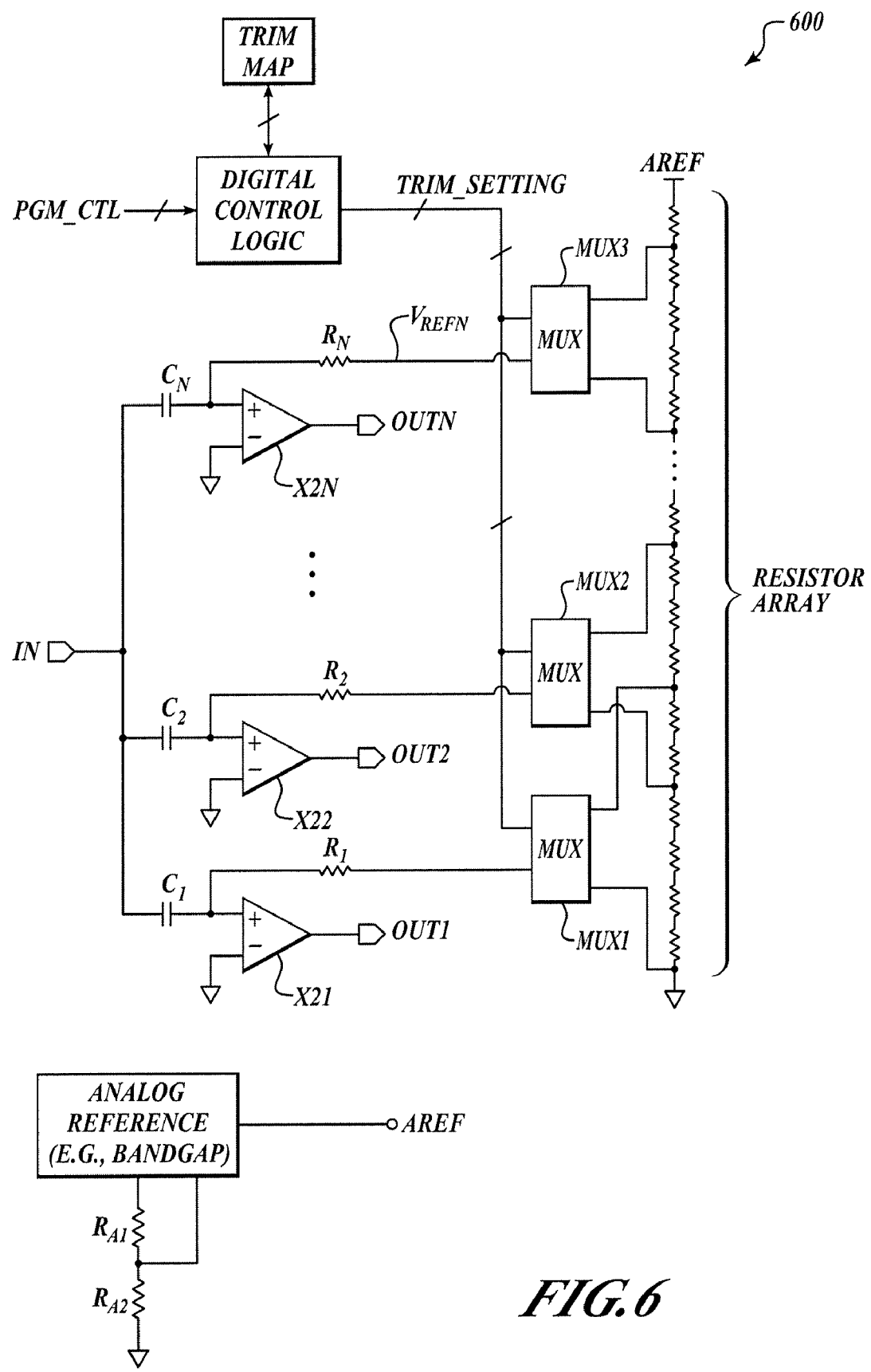
FIG. 6 is a schematic diagram of yet another analog processing circuit that employs capacitive level shifting in accordance with the present disclosure.

FIG. 6 is a schematic diagram of yet another analog processing circuit (600) that employs capacitive level shifting in accordance with the present disclosure. Analog processing circuit 600 is substantially similar to analog processing circuit 200 from FIG. 2. The operation of the remaining circuit components are substantially the same in operation, with like components being similarly labeled.

The DPVR circuit from FIG. 2 is replaced with a resistor array and an array of multiplexer circuits (MUX1–MUXN). The first multiplexer circuit (MUX1) is arranged to provide a first reference voltage (VREF1) to a first high-impedance coupling circuit (R1). The second multiplexer circuit (MUX2) is arranged to provide a second reference voltage (VREF2) to a second high-impedance coupling circuit (R2). The last multiplexer circuit in the array (MUXN) is arranged to provide a last reference voltage (VREFN) to the last high-impedance coupling circuit (RN). Each of the multiplexers is arranged to couple one of the tap points from the resistors array to the respective high impedance coupling circuit. In some instances, the multiplexers can have overlapping voltage ranges as depicted in FIG. 6.

Figure 7:
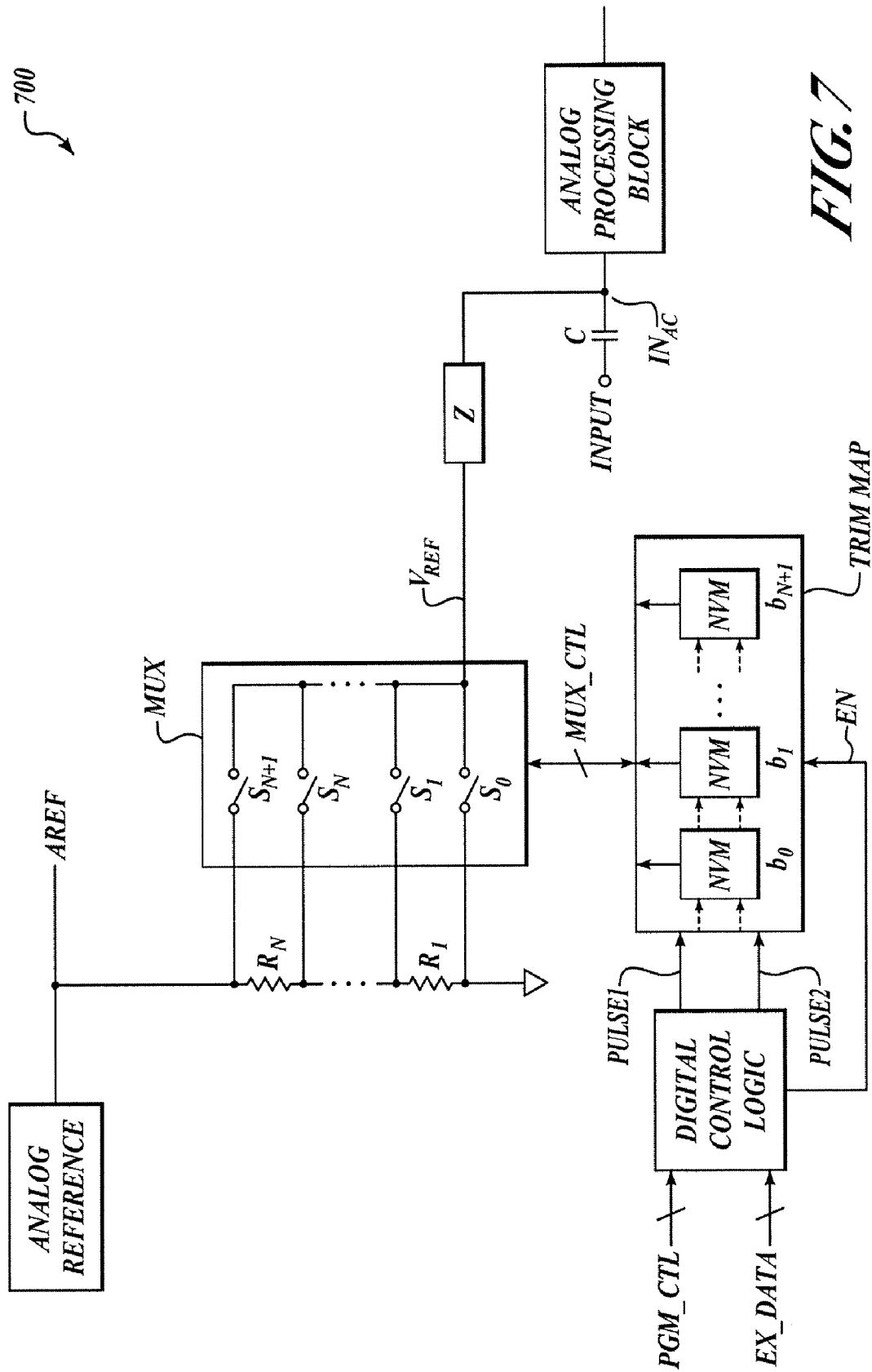
FIG. 7 is a schematic diagram of yet still another analog processing circuit that employs capacitive level shifting in accordance with the present disclosure.

FIG. 7 is a schematic diagram of yet still another analog processing circuit (700) that employs capacitive level shifting in accordance with the present disclosure. Analog processing circuit 700 includes a high-impedance DC coupling circuit (Z), an ac coupling circuit (C), an analog processing block, and a DPVR circuit, and is operated in a similar manner as that described previously with respect to FIG. 3. The DPVR circuit includes an analog reference circuit, a resistor array (R1–RN) and a multiplexer (MUX). The DPVR circuit is programmable via a digital control logic circuit and a trim map circuit.

The trim map circuit may include a number of NVM circuits. Each of the NVM circuit in the trim map are arranged to control one bit (e.g., $b_0$–$b_{N+1}$) for the multiplexer control signal (MUX_CTL). The digital control logic can be arranged to program the NVM circuits using control pulses (e.g., PULSE1, PULSE2, etc.), where the pulses can either inject charge, or remove charge from the NVM circuit to effect programming. Once programmed, the NVM circuits can be accessed to retrieve the program setting to select the appropriate multiplexer settings.

It will be appreciated that a number of advantages result from the disclosure, over the prior art. For one, the above described errors due to device mismatches are reduced by the correction voltage provided by the trim map and the DPVR. Not only are the errors reduced, but large area devices are not needed to correct them, either. So, area is also saved.

In addition, kick back is substantially eliminated because the high Z coupling circuit isolates the DPVR from signal at the coupled node.

Moreover, the individual analog processing blocks can all work at the same DC voltage level. This avoids design effort to accommodate large common mode range, or designing multiple blocks to handle different supply ranges. In addition, no switches are needed, which would add to kick back and add parasitic load.

Methods of the invention are now described according to embodiments. The methods can be implemented in a number of ways, such as by the above-described circuits.

Figure 8:
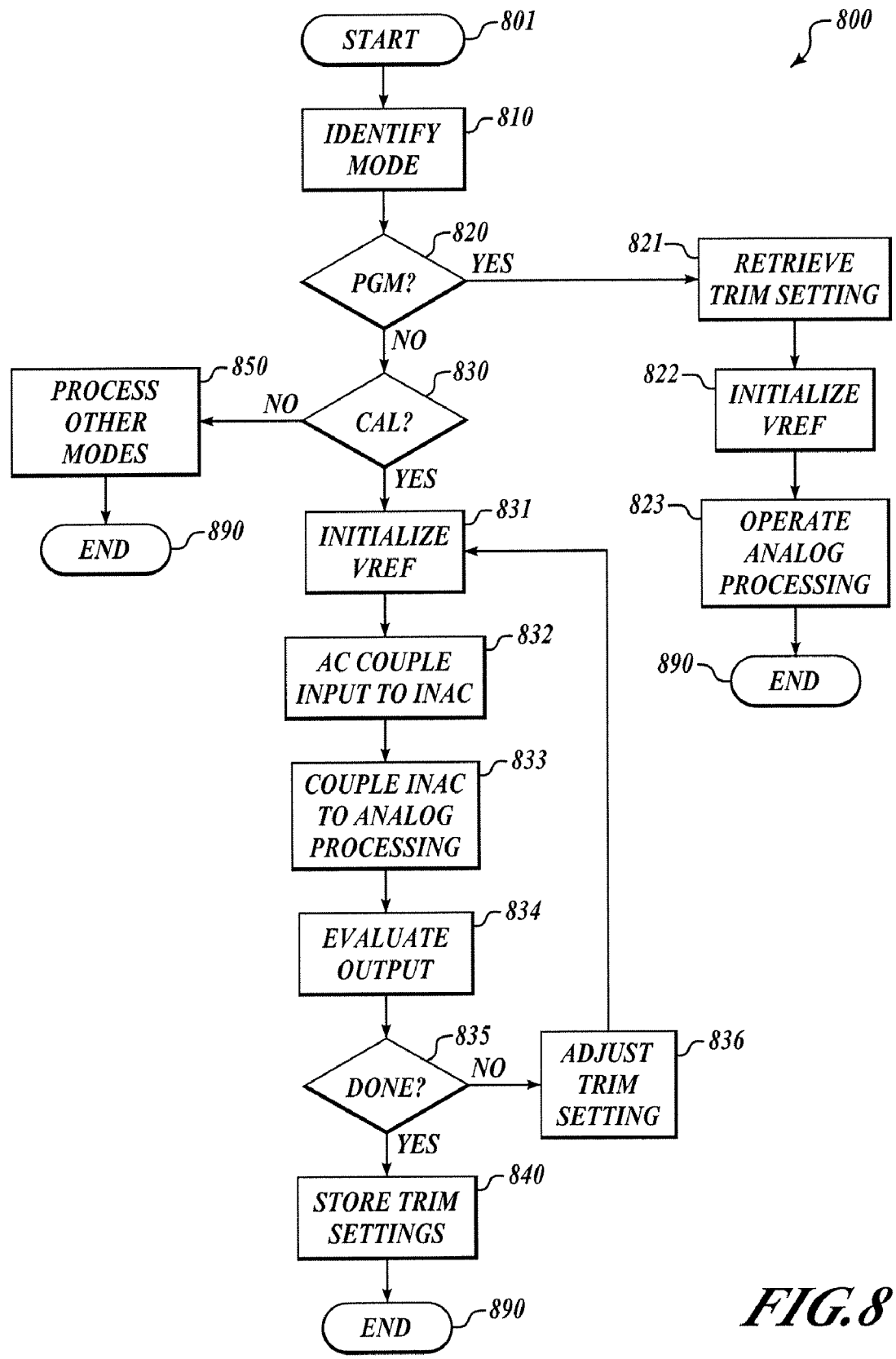
FIG. 8 is a process flow diagram for an analog processing circuit that employs capacitive level shifting in accordance with the present disclosure.

FIG. 8 is a process flow diagram (800) for an analog processing circuit that employs capacitive level shifting in accordance with the present disclosure. The level analog processing circuit may typically be arranged to operate with a number of operating modes. Example operating modes includes programming mode (PGM), calibration mode (CAL). However, additional operating modes may also be used such as store program mode, as well as others.

The circuit initially identifies the selected operating mode at block 810. Processing flows from block 810 to decision block 820. Processing continues to block 821 when the programming mode (PGM) is identified. At block 821 the trim settings are retrieved such as from a trim map circuit as previously described. Alternatively, the trim setting can be retrieved from an external source. Continuing to block 822, the retrieved trim setting is used to initialize the selection of an appropriate voltage reference (VREF) such as from the DPVR circuit previously described. The voltage reference (VREF) is then coupled through a high impedance DC coupling circuit to the analog processing block (e.g., see FIG. 7). Continuing to block 823, the analog processing block can now be operated properly.

Processing continues from decision block 820 to decision block 830 when the programming mode (PGM) is not identified. Decision block 830 determines whether the calibration mode (CAL) has been selected. Processing continues to block 831 when the calibration mode is selected. At block 831, the reference voltage (VREF) from the DPVR circuit is selected. At block 832, a test signal is coupled to the input node as an AC signal (e.g., INAC). Continuing to block 833, the analog processing block processes the signal INAC. Flowing to block 834, the output of the analog processing block is evaluated. Decision block 835 determines if the desired result of the evaluation has been achieved. When additional processing is desired, processing continues from decision block 835 to block 836, where the trim settings are adjusted and processing continues back at block 831.

When additional processing is not desired, processing continues from decision block 835 to block 840. At block 840, the trim settings that have been identified as satisfactory are stored for later use (e.g., stored in a trim map, placed in a data file for later use, Non Volatile Memory (NVM), Random Access Memory (RAM), etc.). Processing flows from block 840 to block 890, which is a termination block.

When the calibration mode is not detected at decision block 830, processing continues to block 850 where other modes can be processed as may be desired. Examples of other operating mode includes a program store mode, where externally provided trim settings can be stored in a trim map circuit, or perhaps a load setting mode, where externally provided trim settings are loaded into a temporary memory (e.g., a latch circuit, a register, etc.) for adjusting the operational settings as may be desired.

What is claimed is:

1. An apparatus that includes facility for level shifting an input signal, comprising:
    an AC coupling circuit that is coupled between a first node and a second node, wherein the first node is arranged to receive the input signal, and wherein the AC coupling circuit is arranged to AC couple the input signal to the second node;
    an analog processing block that includes an input terminal that is coupled to the second node, wherein the input terminal of the analog processing block comprises a gate of a field effect transistor;
    a digitally programmed voltage reference circuit that is arranged to provide a reference signal to a third node in response to a digital control signal, wherein the digitally programmed voltage reference circuit comprises an analog reference voltage generator circuit that is coupled to a voltage divider circuit that includes a set of tap-points, wherein each of the set of tap-points in the voltage divider circuit are coupled to a respective input of a multiplexer circuit, wherein one of the set of tap points is selectively coupled to the third node in response to the digital control signal; and
    a high impedance DC coupling circuit that is coupled between the second node and the third node such that a DC level associated with the second node is adjusted by the digitally programmed voltage reference circuit such that the input terminal of the analog processing block has a precisely adjusted DC level.

2. The apparatus of claim 1, wherein the analog processing block includes at least one of: an amplifier circuit that includes an amplifier input that is coupled to the second node, and a comparator circuit that includes a comparator input that is coupled to the second node.

3. The apparatus of claim 1, wherein the AC coupling circuit comprises one of a capacitor circuit, a single capacitor, a plurality of capacitors, a transistor circuit that is arranged to operate as a capacitor, a poly-silicon capacitor, and a metal plate capacitor.

4. The apparatus of claim 1, wherein the high impedance DC coupling circuit comprises at least one of: a first resistor circuit, a transistor circuit that is biased to operate as a second resistor circuit, a doped poly-silicon resistor circuit, an un-doped poly-silicon resistor circuit, a diffusion resistor circuit, an implant resistor circuit, and a thin film resistor circuit.

5. The apparatus of claim 1, wherein the high impedance DC coupling circuit has a sufficiently high impedance to shield the digitally programmed voltage reference circuit from signal effects of the second node.

6. The apparatus of claim 1, wherein the high impedance DC coupling circuit has a resistance characteristic that is greater than one mega-ohm.

7. The apparatus of claim 1, further comprising: a trim map circuit that is arranged in cooperation with the digitally programmed voltage reference circuit such that previously determined offset levels associated with the input terminal of the analog processing block are adjusted by the digitally programmed voltage reference circuit in response to an output from the trim map circuit.

8. The apparatus of claim 1, wherein the voltage divider circuit comprises: a resistor array that is comprised of a selected material type, and wherein the analog reference voltage generator is a bandgap circuit that employs resistors comprised of the selected material type.

9. The apparatus of claim 1, further comprising a current trim circuit that is arranged to provide an offset current to at least one of the set of tap-points in response to at least one of the digital control signal and another digital control signal that is different from the digital control signal.

10. The apparatus of claim 9, further comprising a trim map circuit that is arranged in cooperation with the current trim circuit such that the offset current that is provided to the at least one of the set of tap-points is identified with a previously determined setting in the trim map circuit.

11. The apparatus of claim 1, further comprising: a trim map circuit that is arranged in cooperation with a digital control logic circuit, wherein the trim map circuit comprises at least one of: a memory circuit, a non-volatile memory (NVM) circuit, a fuse circuit, an anti-fuse circuit, a ROM circuit, an EPROM circuit, an EEPROM circuit, a programmable logic device (PLD) circuit, a latch circuit, a register circuit, and a random access memory (RAM) circuit.

12. The apparatus of claim 1, the high impedance DC coupling circuit comprising an un-doped poly-silicon resistor circuit that is arranged such that no diffusion contacts the second node of the apparatus.

13. The apparatus of claim 1, wherein the digitally programmed voltage reference circuit comprises: a resistor array that is configured to selectively generate the reference signal, wherein the resistor array comprises at least one of: a series resistor circuit, a parallel resistor circuit, a combined series/parallel circuit, a resistor ladder circuit, and an R-2R resistor ladder circuit.

14. An apparatus that includes facility for level shifting an input signal for signal processing, comprising:
- a first AC coupling circuit that is arranged to couple the input signal to a first input node such that the first input node has a first input signal that is responsive to the input signal;
- a second AC coupling circuit that is arranged to AC couple the input signal to a second input node such that the second input node has a second input signal that is responsive to the input signal;
- a first processing block that includes a first input terminal that is coupled to the first input node, wherein the first processing block includes at least one of: a first amplifier circuit and a first comparator circuit, and wherein the first processing block is arranged to provide a first output signal in response to the first input signal;
- a second processing block that includes a second input terminal that is coupled to the second input node, wherein the second processing block includes at least one of: a second amplifier circuit and a second comparator circuit, and wherein the second processing block is arranged to provide a second output signal in response to the second input signal, wherein the first processing block and the second processing block have matched operating functions;
- a first digitally programmed voltage reference circuit that is arranged to provide a first reference signal to a first reference node in response to a first digital control signal;
- a second digitally programmed voltage reference circuit that is arranged to provide a second reference signal to a second reference node in response to a second digital control signal;
- a first high impedance DC coupling circuit that is coupled between the first reference node and the first input node, wherein the first high impedance DC coupling circuit is arranged to couple the first reference signal to the first input node such that the first input signal at the input terminal of the first processing block has a first offset level that is adjusted by the first reference signal; and
- a second high impedance DC coupling circuit that is coupled between the second reference node and the second input node, wherein the second high impedance DC coupling circuit is arranged to couple the second reference signal to the second input node such that the second input signal at the second input terminal of the second processing block has a second offset level that is adjusted by the second reference signal, wherein the second offset level is different from the first offset level.

15. The apparatus of claim 14, wherein the first high impedance DC coupling circuit is arranged to shield the first digitally programmed voltage reference circuit from the first input node, and wherein the second high impedance DC coupling circuit is arranged to shield the second digitally programmed voltage reference circuit from the second input node.

16. The apparatus of claim 14, wherein the first high impedance DC coupling circuit and the second high impedance DC coupling circuit each have a nominal resistance of at least one hundred (100) Mega-Ohms.

17. The apparatus of claim 14, wherein the first digitally programmed voltage reference circuit and the second digitally programmed voltage reference circuit are combined in a common digitally programmed voltage reference circuit.

18. The apparatus of claim 17, wherein the common digitally programmed voltage reference circuit includes a voltage divider circuit that includes a plurality of tap-points, a first multiplexer circuit that is arranged to select one of a first set of the plurality of tap points as the first reference signal, and a second multiplexer circuit that is arranged to select one of a second set of the plurality of tap points as the second reference signal.

19. The apparatus of claim 18, wherein a selected one of the tap points from the first set of tap points is in common with another selected one of the tap points from the second set of tap points.

20. The apparatus of claim 14, further comprising a trim map circuit that is arranged to select the first reference signal and the second reference signal in response to the first digital control signal and the second digital control signal, respectively such that previously determined offset voltages associated with the first input node and the second input node are selected via the trim map circuit.

21. The apparatus of claim 14, further comprising a decoder circuit that is coupled to the outputs of the first processing block and the second processing block, and further arranged to provide a digital output signal for a flash conversion of the input signal.

22. A method for level shifting an input signal for signal processing, the method comprising:
- ac coupling the input signal to a plurality of input nodes, wherein each of the input nodes is associated with a respective processing circuit that includes either an amplifier or a comparator, wherein the operating functions of the processing circuits are matched to one another;
- selecting a trim setting associated with each input node for each respective processing circuit;
- initializing at least one digitally programmed voltage reference to select a plurality of reference signals in response to the selected trim setting;
- dc coupling the selected reference signals to each of the input nodes via a plurality of respective high impedance circuits such that each signal at each respective input node is level shifted in response to the respective reference signal; and
- operating each processing circuit with the input signal, wherein the operation of the processing circuit is enhanced by DC level shifting the input signal at the input node via the plurality of reference signals.

23. The method of claim 22, further comprising: retrieving the trim setting from a trim map circuit in response to a digital control signal such that previously determined offset levels may be selected in response to the digital control signal, wherein the trim map circuit comprises at least one of: a memory circuit, a non-volatile memory (NVM) circuit, a fuse circuit, an anti-fuse circuit, a ROM circuit, an EPROM circuit, an EEPROM circuit, a programmable logic device (PLD) circuit, a latch circuit, a register circuit, and a random access memory (RAM) circuit.

24. The method of claim 22, further comprising: retrieving the trim setting from a signal that is provided from an external source.

25. A method for determining offset levels for level shifting an input signal for signal processing, the method comprising:
- cycling through selection of an input node for signal processing, wherein the input node corresponds to one of a plurality of input nodes, and for each selected input node:
  - ac coupling the input signal to the selected input node, wherein the input node is associated with a high impedance input of a processing circuit from a plurality of matched processing circuits that each include at least one of an amplifier and a comparator;

selecting a trim setting associated with the selected input node for the processing circuit;

initializing a digitally programmed voltage reference to select a reference signal in response to the selected trim setting, wherein the selected reference signal is associated with a DC level for offsetting the input signal at the high impedance input of the processing circuit;

dc coupling the selected reference signal to the input node via a high impedance circuit such that the input node is level shifted in response to the reference signal;

operating the processing circuit with the input signal, wherein the operation of the processing circuit is responsive to the combination of the DC level and the AC coupled input signal at the high impedance input;

evaluating an output associated with the processing circuit for the selected trim setting; and cycling though additional trim settings until the evaluated output associated with the processing circuit attains a desired result.

26. The method of claim 25, further comprising: storing trim settings associated with the processing circuit in a trim map circuit that comprises at least one of: a memory circuit, a non-volatile memory (NVM) circuit, a fuse circuit, an anti-fuse circuit, a ROM circuit, an EPROM circuit, an EEPROM circuit, a programmable logic device (PLD) circuit, a latch circuit, a register circuit, and a random access memory (RAM) circuit.

27. The method of claim 25, further comprising: storing trim settings associated with the processing circuit in an external trim data store.

* * * * *